(12) United States Patent
Patel et al.

(10) Patent No.: US 11,784,075 B2
(45) Date of Patent: *Oct. 10, 2023

(54) BATCH SUBSTRATE SUPPORT WITH WARPED SUBSTRATE CAPABILITY

(71) Applicant: APPLIED MATERIALS, INC., Santa Clara, CA (US)

(72) Inventors: Shashidhara Patel, Bangalore (IN); Ananthkrishna Jupudi, Singapore (SG); Ribhu Gautam, Bengaluru (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 129 days.

This patent is subject to a terminal disclaimer.

(21) Appl. No.: 17/227,442

(22) Filed: Apr. 12, 2021

(65) Prior Publication Data

US 2021/0233790 A1 Jul. 29, 2021

Related U.S. Application Data

(63) Continuation of application No. 16/198,417, filed on Nov. 21, 2018, now Pat. No. 11,361,981.

(60) Provisional application No. 62/666,060, filed on May 2, 2018.

(51) Int. Cl.
*H01L 21/67* (2006.01)
*H01L 21/677* (2006.01)
*C23C 16/458* (2006.01)
*H01L 21/68* (2006.01)
*H01L 21/673* (2006.01)

(52) U.S. Cl.
CPC .... *H01L 21/67757* (2013.01); *C23C 16/4583* (2013.01); *H01L 21/67346* (2013.01); *H01L 21/68* (2013.01)

(58) Field of Classification Search
USPC ............. 156/345.51, 345.52; 118/725, 728
See application file for complete search history.

(56) References Cited

U.S. PATENT DOCUMENTS

| | | |
|---|---|---|
| 5,626,456 A | 5/1997 | Nishi |
| 5,820,683 A | 10/1998 | Ishii et al. |
| 9,696,097 B2 | 7/2017 | Bera et al. |
| 2004/0099219 A1* | 5/2004 | Park .................. H01L 21/67309 118/724 |

(Continued)

FOREIGN PATENT DOCUMENTS

| | | |
|---|---|---|
| KR | 10-2008-0082270 A | 9/2008 |
| KR | 10-1625478 B1 | 5/2016 |
| WO | WO 2013/173999 A1 | 11/2013 |

OTHER PUBLICATIONS

International Search Report and Written Opinion for PCT/US2019/029957 dated Aug. 16, 2019.

*Primary Examiner* — Ram N Kackar
(74) *Attorney, Agent, or Firm* — MOSER TABOADA

(57) ABSTRACT

Methods and apparatus for supporting substrates are provided herein. In some embodiments, a substrate support for supporting a plurality of substrates includes: a plurality of substrate support elements having a ring shape configured to support a plurality of substrates in a vertically spaced apart relation; and a plurality of substrate lift elements interfacing with the plurality of substrate support elements and configured to simultaneously selectively raise or lower substrates off of or onto respective substrate support elements.

19 Claims, 8 Drawing Sheets

(56) References Cited

U.S. PATENT DOCUMENTS

| | | |
|---|---|---|
| 2005/0158164 A1 | 7/2005 | Lee |
| 2009/0031955 A1* | 2/2009 | Lu .................... C23C 16/4584 |
| | | 279/3 |
| 2012/0170999 A1 | 7/2012 | Sakaue |
| 2012/0240857 A1* | 9/2012 | Morozumi ........ H01L 21/67109 |
| | | 118/725 |
| 2014/0251209 A1 | 9/2014 | Obu et al. |
| 2014/0318456 A1 | 10/2014 | Shin et al. |
| 2016/0032322 A1* | 2/2016 | Ray .................... A61P 29/00 |
| | | 435/377 |
| 2016/0033205 A1 | 2/2016 | Bera et al. |
| 2016/0195331 A1 | 7/2016 | Hyon et al. |
| 2016/0284578 A1* | 9/2016 | Weaver ............. H01L 21/67201 |

\* cited by examiner

BATCH SUBSTRATE SUPPORT WITH WARPED SUBSTRATE CAPABILITY

CROSS-REFERENCE TO RELATED APPLICATIONS

This application is a continuation of U.S. patent application Ser. No. 16/198,417, filed Nov. 21, 2018, which claims the benefit of U.S. Provisional Patent Application Ser. No. 62/666,060, filed on May 2, 2018, which are herein incorporated by reference in their entireties.

FIELD

Embodiments of the present disclosure generally relate to semiconductor substrate processing equipment, and more particularly, to batch substrate supports for supporting a plurality of substrates for use in such processing equipment.

BACKGROUND

In the processing of semiconductor substrates, or wafers, in the formation of integrated circuit structures thereon, substrates are often degassed between processes to remove adsorbed gases, moisture, etc. from the substrate prior to, for example, performing deposition or other processes on the substrate. If the absorbed gaseous impurities are not removed prior to subsequent processing, they may undesirably outgas during the process, leading to contamination, quality reduction, or the like.

In addition, the inventors have observed that many conventional degassing chambers process a single substrate at a time. Multiple degassing chambers can be provided to increase throughput. However, such a solution is costly.

Thus, the inventors have provided improved methods and apparatus for supporting a plurality of substrates as well as improved methods and apparatus for degassing substrates.

SUMMARY

Methods and apparatus for supporting substrates are provided herein. In some embodiments, a substrate support for supporting a plurality of substrates includes: a plurality of substrate support elements having a ring shape configured to support a plurality of substrates in a vertically spaced apart relation; and a plurality of substrate lift elements interfacing with the plurality of substrate support elements and configured to simultaneously selectively raise or lower substrates off of or onto respective substrate support elements.

In some embodiments, a substrate support for supporting a plurality of substrates includes: a lift base; a plurality of substrate lift members coupled to the lift base; a support base disposed between the lift base and the plurality of substrate lift members and movable with respect to the lift base; and a plurality of substrate support members coupled to the support base and configured to support a plurality of substrates in a vertically spaced apart relation, wherein the plurality of substrate lift members interface with the plurality of substrate support members to selectively raise or lower substrates off of or onto respective substrate support members.

In some embodiments, a substrate processing system includes a process chamber having an interior volume; a substrate support disposed in the interior volume, the substrate support having a lift base coupled to a plurality of lift members via a lift arm and a support base coupled to a plurality of support members via a support arm; a selectively sealable opening formed in a wall of the process chamber; and a first actuator coupled to the lift base to control a position of the plurality of lift members at least between a transfer position and a processing position.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
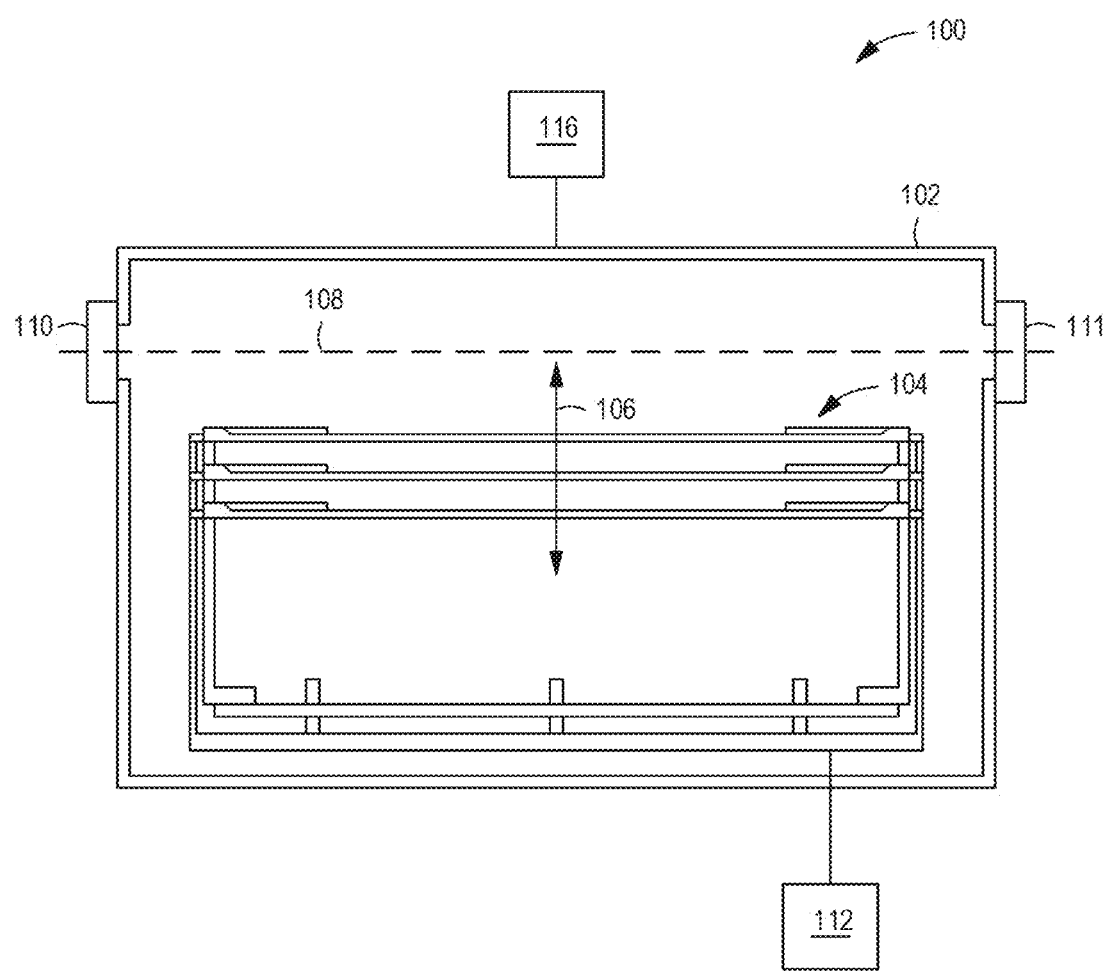
FIG. 1 is a schematic side view of a substrate processing system including a substrate support in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of batch substrate supports for supporting a plurality of substrates, and substrate processing chambers incorporating same, are provided herein. Embodiments of the present disclosure advantageously provide full 360 degree substrate backside contact while disposed on the substrate support. Embodiments of the present disclosure further advantageously provide accessibility for batch substrate transfer with substrate transfer robot transfer blade access on at least two sides of the substrate support.

FIG. 1 is a schematic side view of a substrate processing system having a batch substrate support in accordance with at least some embodiments of the present disclosure. The substrate processing system (system 100) includes a substrate processing chamber (process chamber 102) having a substrate support 104 configured to support a plurality of substrates in a spaced apart relation aligned along a common linear axis that is normal to the primary surface of the substrates (e.g., a central axis of the substrates). For example, the substrate support 104 can be configured to support a plurality of substrates in a vertically spaced apart relation, as depicted in FIG. 1. The plurality of substantially planar substrates are of the type typically used in thin film fabrication processes, such as microelectronic device fabrication. For example, the substrates can be round disks, such as semiconductor wafers, epoxy wafers, or the like, or glass or plastic substrates having rectangular or other form factors. The substrate support 104 is configured to support substrates having given dimensions, such as a given diameter, for example 150 mm, 200 mm, 300 mm, 450 mm, or the like, or other given non-circular dimensions, such as rectangular (e.g., a given length and width), or the like. The spacing between respective support elements is sufficient to allow a transfer blade of a substrate transfer robot to deliver or retrieve substrates to or from the substrate support 104.

The substrate support 104 is coupled to an actuator 112 that controls the position of the substrate support 104 at least between a transfer position and a processing position. The actuator 112 can be any suitable linear motion controller, such as a linear drive servo actuator motor, or the like. The actuator 112 may be disposed outside of the process chamber 102 and pass through an opening in the process chamber 102 sealed with, for example, a stainless steel bellows, or the like. In the transfer position, the substrate support 104 is configured to provide access for a transfer blade of a substrate transfer robot to drop off on to or pick up a substrate off of the substrate support 104. In the processing position, the substrate support 104 is configured to support each substrate at least along an entire periphery of the substrate. The transfer position and the processing position are each disposed along the central axis of the substrates, as indicated by arrow 106 in FIG. 1. In order to transfer a plurality of substrates to and from the substrate support, the transfer position may include a plurality of transfer positions, each corresponding to aligning a respective substrate to a substrate transfer plane 108 of the process chamber 102.

One or more openings are provided in the process chamber 102 aligned with the substrate transfer plane 108 to facilitate moving substrates into and out of the process chamber 102. For example, in the embodiment depicted in FIG. 1, a first slit valve 110 and a second slit valve 111 are provided. The first and second slit valves 110, 111 each include an opening in a wall of the process chamber and a door that can selectively open and close the opening to allow a transfer blade of a substrate transfer robot to extend into the process chamber 102 to drop off a substrate onto the substrate support 104, or to receive a substrate from the substrate support 104. In some embodiments, the first and second slit valves 110, 111 are disposed on opposite sides of the process chamber 102.

In the embodiment depicted in FIG. 1, the substrate support 104 includes three vertically spaced apart substrate support elements, or support members. However, fewer or greater numbers of support elements can be provided. In some embodiments, the substrate support elements are spaced about 12.0 mm to about 16.0 mm apart.

The system 100 can be configured for any suitable substrate process performed on a batch of substrates. As such, support systems 116 are operatively coupled to the process chamber 102 to facilitate operation and control of the particular processes being performed in the process chamber 102. In some embodiments, the system 100 is configured to perform a degas process to remove adsorbed gases, moisture, etc. from the substrate prior to, for example, performing deposition or other processes on the substrate (e.g., the process chamber 102 is a degas chamber). In such embodiments, the support systems can include a heat source, such as a microwave heat source, a variable frequency microwave heat source, or the like, a gas source, such as an inert gas source or the like, an exhaust system, a process controller, etc.

Figure 2:
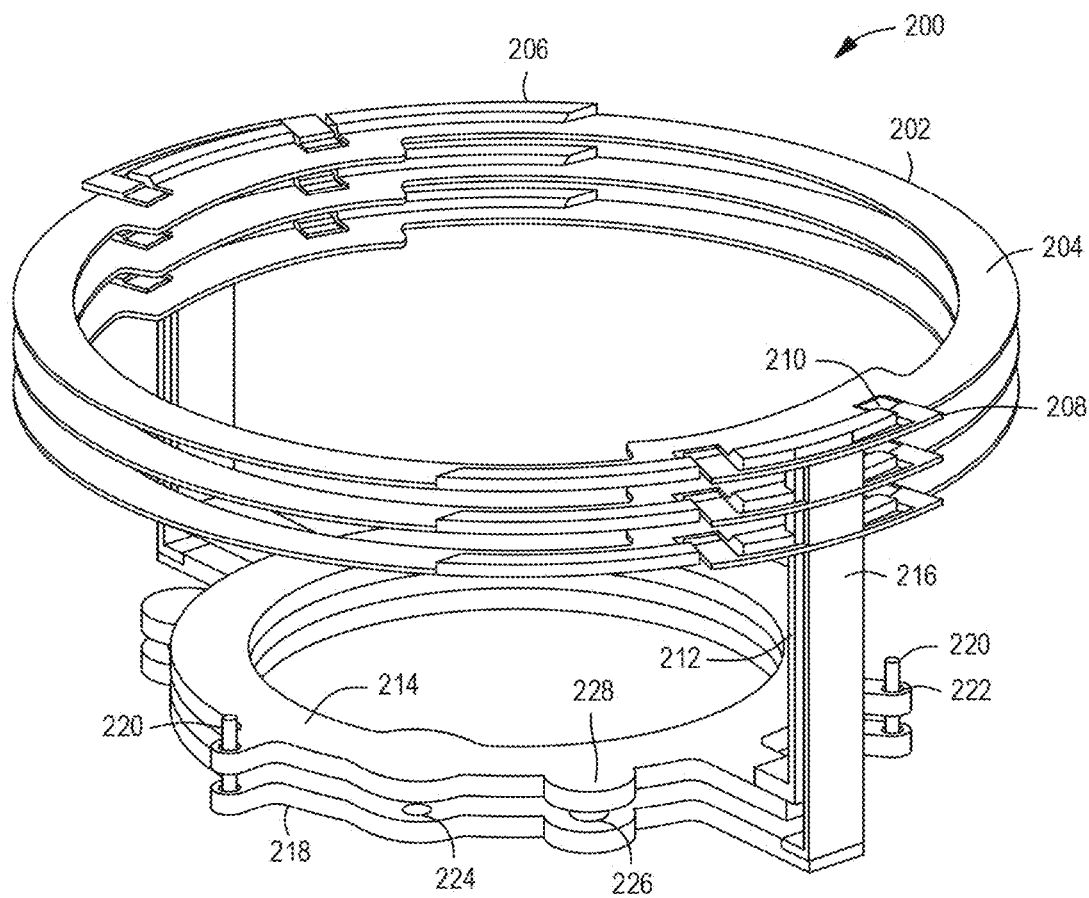
FIG. 2 is an isometric view of a substrate support in accordance with at least some embodiments of the present disclosure.

FIG. 2 is an isometric view of a substrate support 200 in accordance with at least some embodiments of the present disclosure. The substrate support 200 can be the substrate support 104 discussed above with respect to FIG. 1.

The substrate support 200 includes a support assembly including a plurality of support members 202 disposed in a spaced apart relation along a common axis of the substrate support (e.g., aligned along a vertical axis). The support member 202 can be configured as a ring having a central opening (as depicted in FIG. 2) or as a plate, or in some other planar geometry. Providing the support member 202 as a ring or as a plate advantageously provides full support of the substrate and can further assist in flattening warped substrates in certain applications, such as when substrates are heated when disposed upon the support members 202.

Each support member 202 includes a support surface 204. The support surface 204 is a substantially planar surface to support a respective substrate and is configured to support a substrate having a given dimension (e.g., a given diameter for round substrates, a given length and width for rectangular substrates, or the like). In some embodiments, one or more support guides 206 may be provided to guide and retain a substrate in position on the support surface 204 of the support member 202. The support guides include a sloped surface that guides a substrate toward a centered position on the support surface 204 and helps maintain the centered position of the substrate during processing and during transfers. For example, the sloped surface may extend from an upper radially outward position to a lower radially inward position with respect to the support surface 204 such that a substrate contacting the support guide 206 will be nudged toward a centered position on the support surface 204 as the substrate is moved toward the support surface 204. In some embodiments, a pair of support guides 206 are disposed on opposite sides of the support surface 204. In some embodiments, the one or more support guides 206 are disposed along an outer peripheral edge of the support member 202.

The substrate support 200 further includes a lift assembly having a plurality of lift members 208 corresponding to the plurality of support members 202. Each lift member 208 includes one or more lift surfaces 210. The lift surfaces 210 are substantially planar surfaces to support a respective substrate and are configured to support a substrate having the given dimension discussed above with respect to the support surface 204. In some embodiments, a plurality of lift surfaces may be provided for a single lift member 208. In some embodiments, a plurality of lift members 208 may be provided for each respective support member 202. For example, in embodiments consistent with FIG. 2, a pair of lift members 208 are provided for each respective support member 202. In some embodiments, consistent with FIG. 2, a pair of lift surfaces 210 are provided for each respective lift member 208.

The plurality of lift members 208 (and corresponding lift surfaces 210) are movable with respect to the support members 202 (and corresponding support surfaces 204) between a processing position, in which the lift surfaces 210 are disposed below the support surfaces 204 and a transfer position, in which the lift surfaces 210 are disposed above the support surfaces 204. In some embodiments, in the transfer position, the lift surfaces 210 are disposed about 7.0 mm to about 9.0 mm above the support surfaces 204

Each support member 202 is configured to interface with the one or more lift members 208 that correspond with that support member 202. For example, openings, holes, and/or slots 252 may be provided in portions of the support members 202 to facilitate movement of the lift members 208 with respect to the support members 202. In some embodiments, the lift members are disposed radially outward of the support members and include inwardly directed fingers having the lift surfaces 210. The inwardly directed fingers (and lift surfaces 210) extend into corresponding slots formed through the support members 202 to facilitate vertical movement therebetween (e.g., to achieve the processing and transfer positions discussed above).

In some embodiments, the lift surfaces 210 are disposed proximate the support guides 206. For example, in some embodiments, the lift surfaces 210 are disposed adjacent to the support guides 206. In some embodiments, the lift surfaces 210 are disposed in positions that at least partially overlap with the support guide 206. In some embodiments, the lift surfaces 210 and the support guides 206 are alternatingly disposed (e.g., at least one lift surface 210 is disposed between at least one support guide 206, and/or at least one support guide 206 is disposed between at least one lift surface 210).

In some embodiments, the plurality of support members 202 may be coupled to one or more support arms 212 to maintain the support members 202 in a spaced apart relation and to move the plurality of support members 202 in unison. In some embodiments, and as depicted in FIG. 2, two support arms 212 are disposed on opposite sides of the support members 202. The one or more support arms 212 can be coupled to a support base 214.

In some embodiments, the plurality of lift members 208 may be coupled to one or more lift arms 216 to maintain the lift members 208 in a spaced apart relation and to move the plurality of lift members 208 in unison. The one or more lift arms 216 can be coupled to a lift base 218. In some embodiments, and as depicted in FIG. 2, two lift arms 216 are disposed opposite each other. In some embodiments, and as depicted in FIG. 2, two lift arms 216 are disposed opposite each other, each supporting a separate lift member 208. In some embodiments, the one or more lift arms 216 are disposed radially outward of the one or more support arms 212.

In some embodiments, the support base 214 is movably disposed on the lift base 218. For example, the support base 214 may be movably coupled to the lift base 218, or the support base 214 may merely rest upon the lift base 218 without being coupled to the lift base 218. Guide pins 220 may be disposed in, or at least extend from the lift base 218. In such embodiments, corresponding guide openings 222 are provided through support base 214 to interface with the guide pins 220. The guide openings 222 can be holes or slots or other features formed through the support base 214 having a geometry designed to allow the guide pins 220 to extend through the support base 214 and to allow the support base 214 to freely move along the guide pins 220. For example, the guide pins 220 can support the alignment of the support members 202 as the support base 214 moves away from or closer to the lift base 218 in an axial direction.

In some embodiments, one or more openings 224 may be provided in the lift base 218 to facilitate coupling the lift base 218 to an actuator (such as actuator 112 discussed above with respect to FIG. 1) to control the position of the lift base 218.

To facilitate control of the relative positions of the lift base 218 and the support base 214, in some embodiments, one or more openings 226 can be formed through the lift base 218 and a corresponding one or more strike surfaces 228 may be positioned on the support base 214. The strike surfaces 228 overlie the openings 226. One or more posts (see posts 404 discussed below with respect to FIG. 4) may be provided, for example in the process chamber, and positioned with respect to the openings 226 such that the posts can pass into and through the lift base 218 as the lift base 218 is moved with respect to the posts. The posts, upon passing through the openings 226, contact the strike surfaces of the support base 214 such that the support base rests upon the posts. Continued movement, e.g. lowering, of the lift base 218 will move the lift base 218 away from the support base 214, and correspondingly, the lift members 208 will move downward with respect to the support members 202.

Figure 3A:
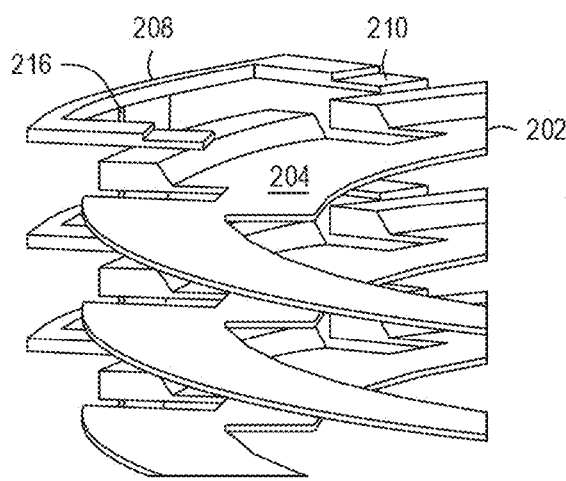
FIGS. 3A and 3B are partial isometric views of a substrate support in different supporting positions in accordance with at least some embodiments of the present disclosure.
Figure 3B:
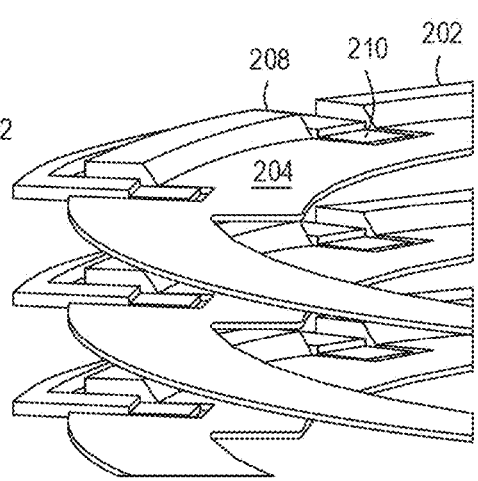

In some embodiments, the lift arms 216 and the support arms 212 each have lengths selected to provide the respective transfer position and processing position discussed above. For example, in some embodiments, the support base 214 is able to rest upon the lift base 218, and when the support base 214 is resting upon the lift base 218, the lift arms 216 and the support arms 212 each have lengths such that the lift surfaces 210 are disposed above the support surfaces 204 (e.g., a transfer position, as depicted in FIG. 3A). In such embodiments, the support base 214 can move away from the lift base 218 by an amount sufficient to position the lift surfaces 210 level with or below the support surfaces 204 (e.g., a processing position, as depicted in FIG. 3B). The support base 214 can move away from the lift base 218 when the support base 214 is in contact with the posts passing through the openings 226 of the lift base 218 and the lift base 218 moves along the posts in a direction away from the support base 214.

Figure 4:
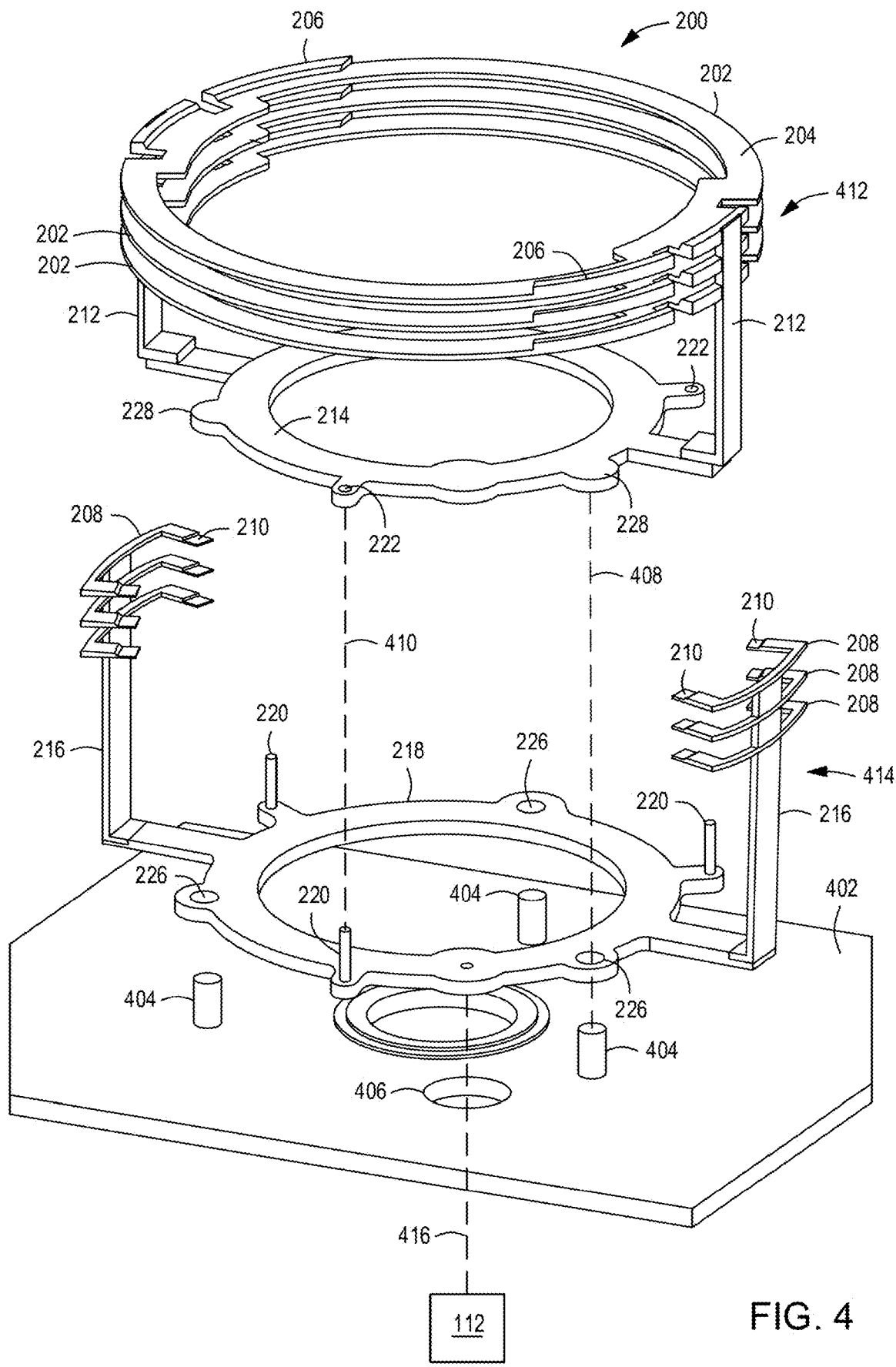
FIG. 4 is an exploded isometric view of a substrate support in accordance with at least some embodiments of the present disclosure.

For example, FIG. 4 is an exploded isometric view of the substrate support 200 in accordance with at least some embodiments of the present disclosure. In the embodiment depicted in FIG. 4, a support assembly 412 is nested within a lift assembly 414. The support assembly 412 includes the support components discussed above with respect to FIG. 2 (e.g., the support member 202, support arm 212, and support base 214). The lift assembly 414 includes the lift components discussed above with respect to FIG. 2 (e.g., the lift member 208, lift arm 216, and lift base 218).

The support base 214 of the support assembly 412 can rest, by gravity, upon the upper surface of the lift base 218, with guide pins 220 extending through the guide openings 222 of the support base 214 (as indicated by dashed line 410). A process chamber component, such as a floor 402 of the process chamber can support one or more posts 404 (three posts 404 shown) that, depending upon the position of the substrate support 200, can extend through the openings 226 of the lift base 218 and can contact the strike surfaces 228 of the support base 214 (as indicated by dashed line 408). The one or more posts 404 can be coupled to the floor 402 in a fixed position. Accordingly, the lift base 218 (and entire lift assembly 414) can move freely, constrained only by the process chamber volume or the stroke of the actuator 112. The support base 214, and the support assembly 412, will move along with the lift base 218 until the lift base 218 moves down enough such that the strike surfaces 228 of the support base 214 contact the upper surface of the posts 404. An actuator shaft, such as of the actuator 112, can extend through an opening 406 in the floor 402 and be coupled to the lift base 218 to control the position of the lift assembly (as indicated by dashed line 416).

Figure 5A:
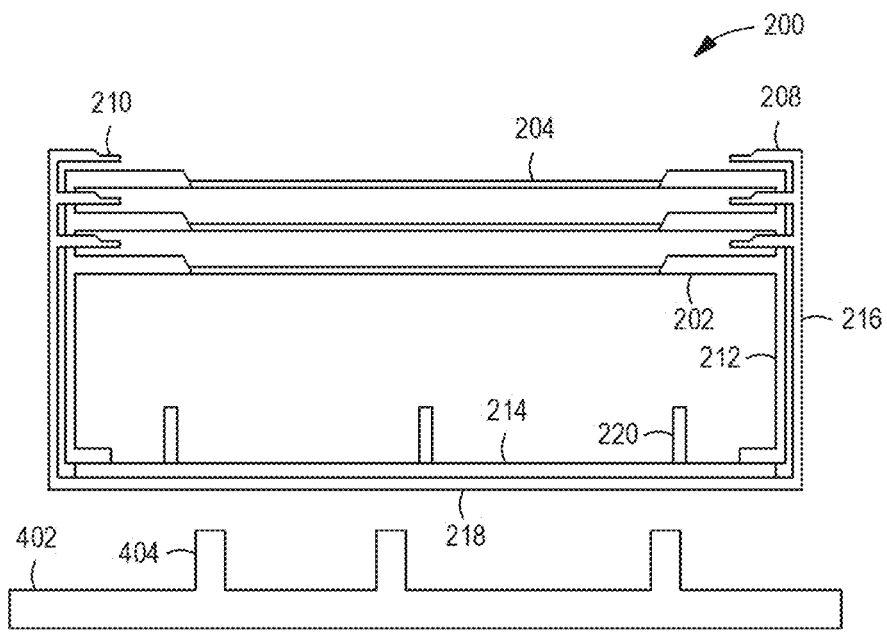
FIGS. 5A and 5B are partial isometric views of a substrate support in different supporting positions in accordance with at least some embodiments of the present disclosure.
Figure 5B:
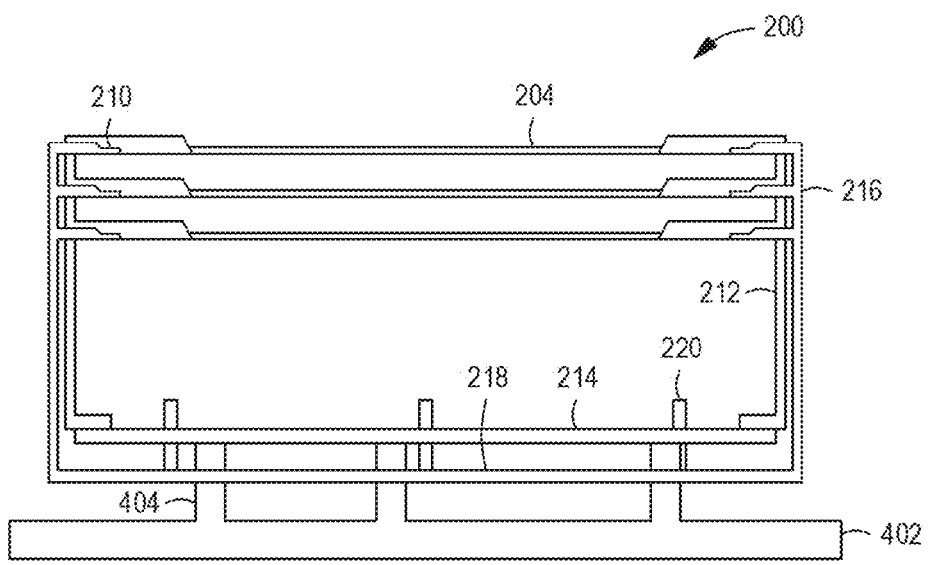

FIGS. 5A and 5B are partial isometric views of a substrate support in different supporting positions in accordance with at least some embodiments of the present disclosure. FIG. 5A shows the substrate support 200 in a transfer position having the lift surfaces 210 disposed above the support surfaces 204. In such a configuration, the actuator (e.g., actuator 112 shown in FIG. 1) lifts the lift base 218 sufficiently to engage the top surface of the lift base 218 with the bottom surface of the support base 214. In the position shown in FIG. 5A, the actuator has further lifted the lift base 218 above the top surface of the posts 404.

FIG. 5B shows the substrate support 200 in a processing position having the lift surfaces 210 disposed even with or below the support surfaces 204. In such a configuration, the actuator (e.g., actuator 112 shown in FIG. 1) lowers the lift base 218 sufficiently to engage the bottom surface of the support base 214 with the top surface of the posts 404. In the position shown in FIG. 5A, the actuator has lowered the lift base 218 sufficiently to position the lift surfaces 210 disposed at or below the support surfaces 204 without the lift surfaces or other portions of the respective lift members 208 intruding into the space between the respective support members 202.

Figure 6:
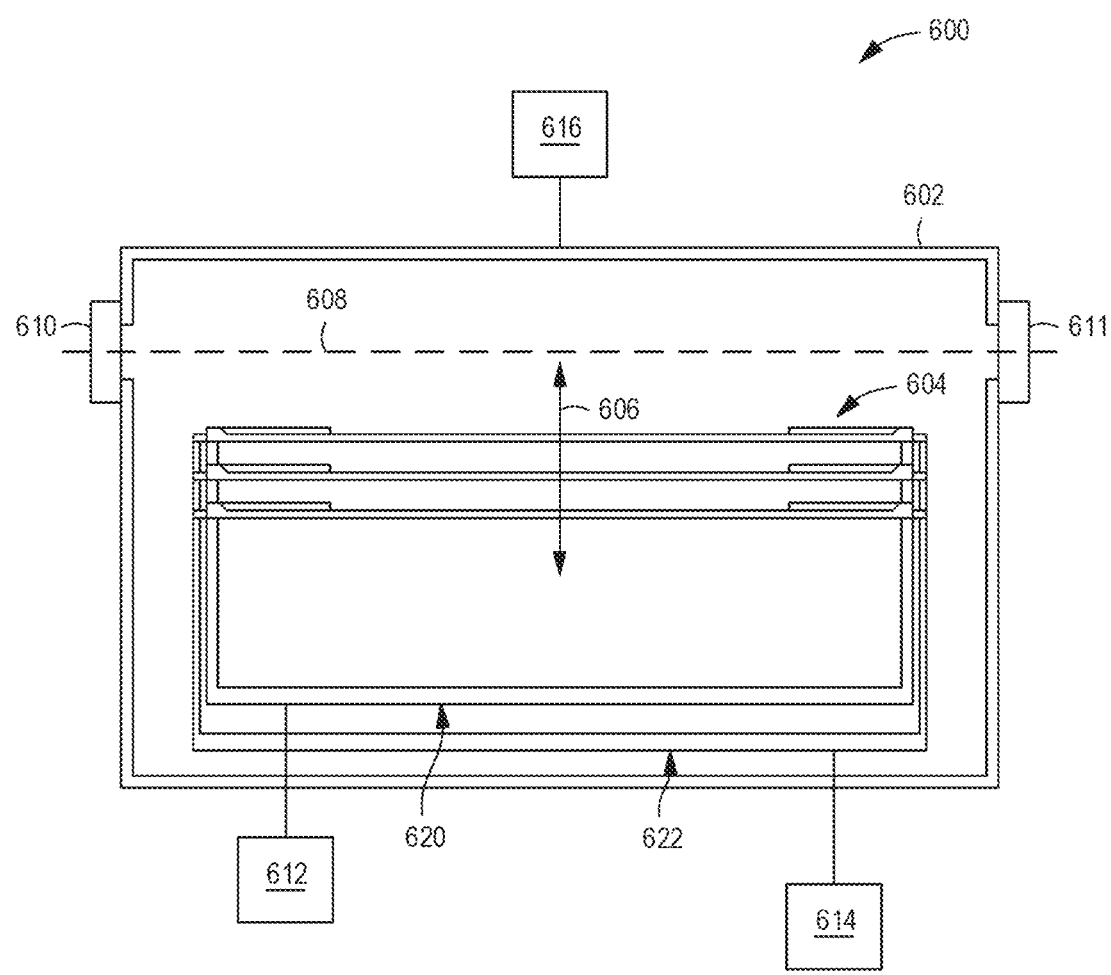
FIG. 6 is a schematic side view of a substrate processing system including a substrate support in accordance with at least some embodiments of the present disclosure.

FIG. 6 is a schematic side view of a substrate processing system having a batch substrate support in accordance with at least some embodiments of the present disclosure. The substrate processing system (system 600) may be similar to system 100 and includes a substrate processing chamber (process chamber 602) having a substrate support 604 configured to support a plurality of substrates in a spaced apart relation aligned along a common linear axis that is normal to the primary surface of the substrates (e.g., a central axis of the substrates). The substrate support 604 is configured to support substrates having given dimensions, such as a given diameter, for example 150 mm, 200 mm, 300 mm, 450 mm, or the like, or other given non-circular dimensions, such as rectangular (e.g., a given length and width), or the like.

The spacing between respective support elements is sufficient to allow a transfer blade of a substrate transfer robot to deliver or retrieve substrates to or from the substrate support 604. In the embodiment depicted in FIG. 6, the substrate support 604 includes three vertically spaced apart substrate support elements, or support members. However, fewer or greater numbers of support elements can be provided. In some embodiments, the spacing between respective support elements is about 18.0 mm to about 19.0 mm.

The substrate support 604 includes a support assembly 620 and a lift assembly 622. The support assembly 620 is coupled to a first actuator 612 that controls a position of the support assembly 620 at least between a transfer position and a processing position of the substrate support 604. The lift assembly 622 is coupled to a second actuator 614 that controls the position of the lift assembly 622 at least between a transfer position and a processing position of the substrate support 604. The support assembly 620 is capable of moving independently from the lift assembly 622. The first actuator 612 and the second actuator 614 can be any suitable linear motion controller, such as a linear drive servo actuator motor, or the like. The first and second actuators 612, 614 may be disposed outside of the process chamber 602 and pass through an opening in the process chamber 602 sealed with, for example, a stainless steel bellows, or the like.

In the transfer position, the substrate support 604 is configured to provide access for a transfer blade of a substrate transfer robot to drop off on to or pick up a substrate off of the substrate support 604. In the processing position, the substrate support 604 is configured to support each substrate along an entire periphery of the substrate. In some embodiments, the substrate support 604 is configured to support each substrate along at least the periphery of the substrate. The transfer position and the processing position are each disposed along the central axis of the substrates, as indicated by arrow 606 in FIG. 6. In order to transfer a plurality of substrates to and from the substrate support, the transfer position may include a plurality of transfer positions, each corresponding to aligning a respective substrate to a substrate transfer plane 608 of the process chamber 602.

One or more openings are provided in the process chamber 602 aligned with the substrate transfer plane 608 to facilitate moving substrates into and out of the process chamber 602. For example, in the embodiment depicted in FIG. 6, a first slit valve 610 and a second slit valve 611 are provided. The first and second slit valves 610, 611 each include an opening in a wall of the process chamber and a door that can selectively open and close the opening to allow a transfer blade of a substrate transfer robot to extend into the process chamber 602 to drop off a substrate onto the substrate support 604, or to receive a substrate from the substrate support 604. In some embodiments, the first and second slit valves 610, 611 are disposed on opposite sides of the process chamber 602.

The system 600 can be configured for any suitable substrate process performed on a batch of substrates, for example, the processes discussed above with respect to system 100. The process chamber 602 is operatively coupled to the support systems 616 to facilitate operation and control of the particular processes being performed in the process chamber 602

Figure 7:
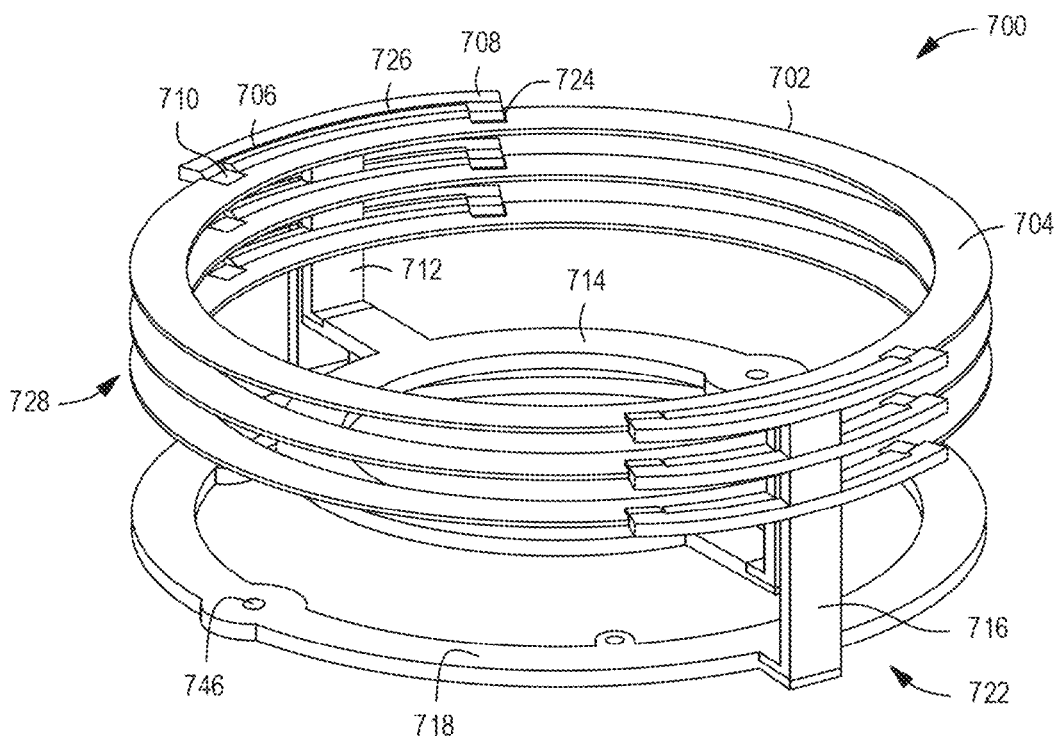
FIG. 7 is an isometric view of a substrate support in accordance with at least some embodiments of the present disclosure.

FIG. 7 is an isometric view of a substrate support 700 in accordance with at least some embodiments of the present disclosure. The substrate support 700 can be the substrate support 604 discussed above with respect to FIG. 6. The substrate support 700 includes a support assembly 728 including a plurality of support members 702 disposed in a spaced apart relation along a common axis of the substrate support (e.g., aligned along a vertical axis). The support member 702 can be configured as a ring having a central opening (as depicted in FIG. 7) or as a plate, or in some other planar geometry. Providing the support member 702 as a ring or as a plate advantageously provides full support of the substrate and can further assist in flattening warped substrates in certain applications, such as when substrates are heated when disposed upon the support members 702.

Each support member 702 includes a support surface 704. The support surface 704 is a substantially planar surface to support a respective substrate and is configured to support a substrate having a given dimension (e.g., a given diameter for round substrates, a given length and width for rectangular substrates, or the like). In some embodiments, one or more support guides 706 may be provided on the support surface 704 of the support member 702. The support guides 706 include a sloped surface 726 configured to guide a substrate toward a centered position on the support surface 704 and help maintain the centered position of the substrate during processing and during transfers. The sloped surface 726 may extend from an upper radially outward position to a lower radially inward position with respect to the support surface 704 such that a substrate contacting the support guide 706 will be nudged toward a centered position on the support surface 704 as the substrate is moved toward the support surface 704. In some embodiments, a pair of support guides 706 are disposed on opposite sides of the support surface 704. In some embodiments, the one or more support guides 706 are disposed along an outer peripheral edge of the support member 702.

The substrate support 700 further includes a lift assembly 722 having a plurality of lift members 708 corresponding to the plurality of support members 702. Each lift member 708 includes one or more lift surfaces 710. The lift surfaces 710 are substantially planar surfaces to support a respective substrate and are configured to support a substrate having the given dimension discussed above with respect to the support surface 704. In some embodiments, a plurality of lift surfaces may be provided for a single lift member 708. In some embodiments, a plurality of lift members 708 may be provided for each respective support member 702. For example, in embodiments consistent with FIG. 7, a pair of lift members 708 are provided for each respective support member 702. In some embodiments, consistent with FIG. 7, a pair of lift surfaces 710 are provided for each respective lift member 708.

The plurality of lift members 708 (and corresponding lift surfaces 710) are movable with respect to the support members 702 (and corresponding support surfaces 704) between a processing position, in which the lift surfaces 710 are disposed coplanar with, or below, the support surfaces 704 and a transfer position, in which the lift surfaces 710 are disposed above the support surfaces 704. In some embodiments, in the transfer position, the lift surfaces 710 are disposed about 9.0 mm to about 13.0 mm above the support surfaces 704.

Each support member 702 is configured to interface with the one or more lift members 708 that correspond with that support member 702. For example, openings, holes, and/or slots 752 may be provided in portions of the support members 702 to facilitate movement of the lift members 708 with respect to the support members 702. In some embodiments, the lift members 708 are disposed radially outward of the support members 702 and include inwardly directed fingers having the lift surfaces 710. The inwardly directed fingers (and lift surfaces 710) extend into corresponding slots 724 formed through the support members 702 to facilitate vertical movement therebetween (e.g., to achieve the processing and transfer positions discussed above).

In some embodiments, the lift surfaces 710 are disposed proximate the support guides 706. For example, in some embodiments, the lift surfaces 710 are disposed adjacent to the support guide 706. In some embodiments, the lift surfaces 710 are disposed in positions that at least partially overlap with the support guide 706. In some embodiments, the lift surfaces 710 and the support guides 706 are alternatingly disposed (e.g., at least one lift surface 710 is disposed between at least one support guide 706, and/or at least one support guide 706 is disposed between at least one lift surface 710).

In some embodiments, the plurality of lift members 708 may be coupled to one or more lift arms 716 to maintain the lift members 708 in a spaced apart relation and to move the plurality of lift members 708 in unison. The one or more lift arms 716 can be coupled to a lift base 718. In some embodiments, and as depicted in FIG. 7, two lift arms 716 are disposed opposite each other. In some embodiments, and as depicted in FIG. 7, two lift arms 716 are disposed opposite each other, each supporting a separate lift member 708. In some embodiments, the one or more lift arms 716 are disposed radially outward of the one or more support arms 712.

Figures 8A, 8B:
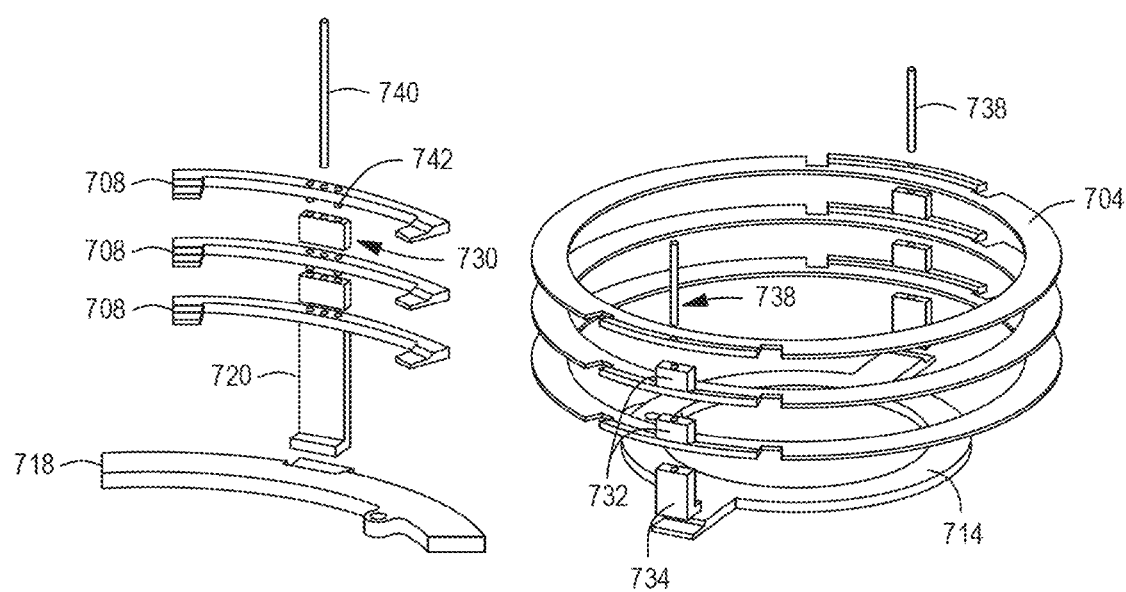
FIGS. 8A and 8B are partial exploded isometric views of the substrate support of FIG. 7 in accordance with at least some embodiments of the present disclosure.

In some embodiments, each lift arm 716 includes spacers 730 disposed between adjacent lift members 708. In some embodiments, each lift arm 716 can further include a post 720 disposed between a lowest lift member 708 and the lift base 718. For example, as shown in FIG. 8A, each lift arm 716 includes two spacers 730 and the post 720 to maintain three lift members 708 in a spaced apart relation with each other and with the lift base 718. A height of the post 720 may be greater than a higher of the spacers 730 such that a distance between the lowest lift member 708 and the lift base 718 is greater than a distance between the lowest lift member 708 and an adjacent lift member 708. In some embodiments, a threaded pin 740 is disposed in a first opening in the lift members 708, a first opening in the spacers 730, and a first opening in the post 720 to couple the lift members 708 to the lift base 718. In some embodiments, one or more dowels 742 may be disposed in additional openings of the lift members 708 and additional openings in an adjacent spacer 730 to advantageously reduce or prevent the lift members 708 from rotating with respect to the lift arm 716.

In some embodiments, the plurality of support members 702 may be coupled to one or more support arms 712 to maintain the support members 702 in a spaced apart relation and to move the plurality of support members 702 in unison. In some embodiments, two support arms 712 are disposed on opposite sides of the support members 702. The one or more support arms 712 can be coupled to a support base 714.

In some embodiments, each support arm 712 includes spacers 732 disposed between adjacent support members 702. In some embodiments, each support arm 712 can further include a post 734 disposed between a lowest support member 702 and the support base 714. For example, as shown in FIG. 8B, each support arm 712 can include two spacers 732 and the post 734 to maintain three support members 702 in a spaced apart relation with each other and with the support base 714. A height of the post 734 may be greater than a higher of the spacers 732 such that a distance between the lowest support member 702 and the support base 714 is greater than a distance between the lowest support member 702 and an adjacent support member 702. In some embodiments, the support members 702 may include an opening that is coaxial with an opening in the spacers 732 and an opening in the post 734. In some embodiments, the opening in the support member 702 passes through the support guide 706. The support assembly 728 may further include a pin 738 configured to pass through the openings of the support members 702, the spacers 732, and the post 734 to couple the support members 702 to the support base 714.

Figure 9:
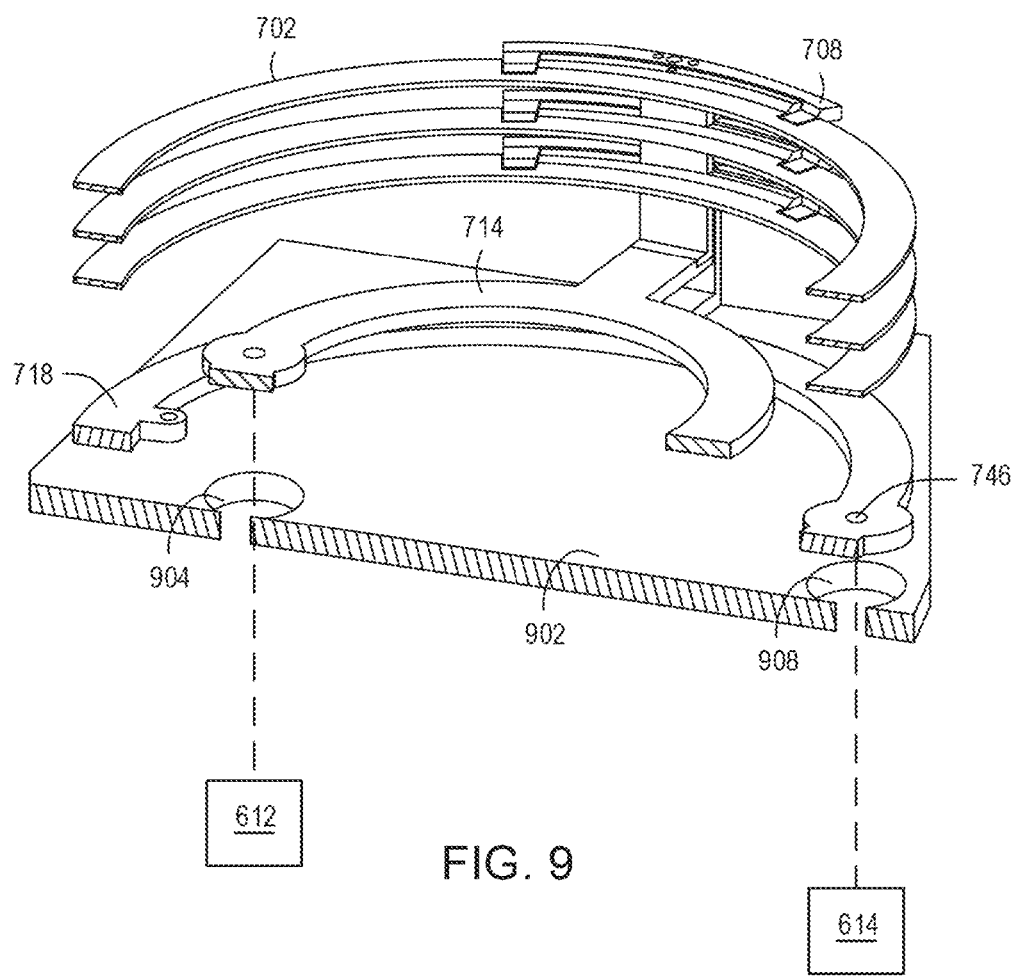
FIG. 9 is a cross sectional isometric view of the substrate support of FIG. 7 in accordance with at least some embodiments of the present disclosure.

FIG. 9 is a cross sectional isometric view of the substrate support of FIG. 7. In some embodiments, one or more openings 746 are provided in the support base 714 to facilitate coupling the support base 714 to a first actuator (such as the first actuator 612 discussed above with respect to FIG. 6). The first actuator 612 may include an actuator shaft that can extend through an opening 904 through a chamber floor 902 and be coupled to the support base 714. In some embodiments, one or more openings 746 are provided in the lift base 718 to facilitate coupling the lift base 718 to a second actuator (such as the second actuator 614 discussed above with respect to FIG. 6). The second actuator 614 may include an actuator shaft that can extend through an opening 908 through the chamber floor 902 and be coupled to the lift base 718. The first actuator 612 and the second actuator 614 are configured to control a position of the support assembly 728 and the lift assembly 722, respectively. Accordingly, the support base 714 (and entire support assembly 728) can move freely, constrained only by the process chamber volume or the stroke of the first actuator 612. The lift base 718 (and entire lift assembly 722) can move freely, constrained only by the process chamber volume or the stroke of the second actuator 614.

In some embodiments, the lift arms 716 and the support arms 712 each have lengths selected to provide the respective transfer position and processing position discussed above. For example, in some embodiments, the support arm 712 is shorter than the lift arm 716 such that the support base 714 is elevated with respect to the lift base 718. In some embodiments, where the lift base 718 has a ring shape, an inner sidewall of the lift base 718 has a diameter greater than an outer diameter of the support base 714.

Figure 10A:
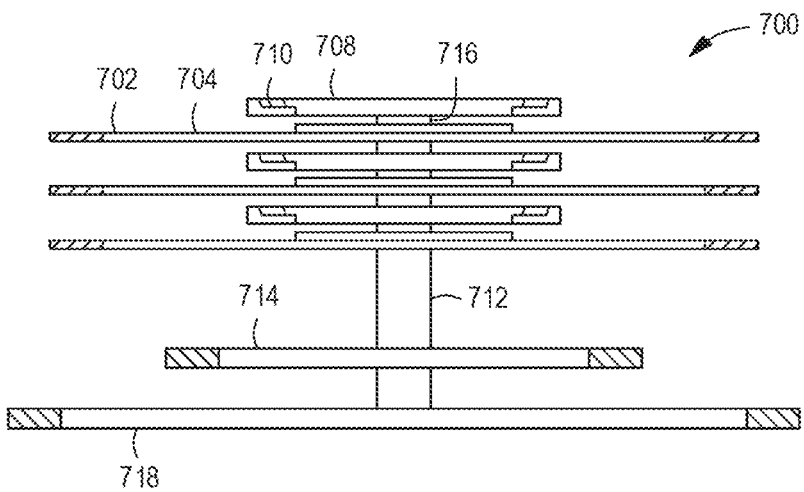
FIGS. 10A and 10B are partial cross sectional isometric views of a substrate support in different supporting positions in accordance with at least some embodiments of the present disclosure.
Figure 10B:
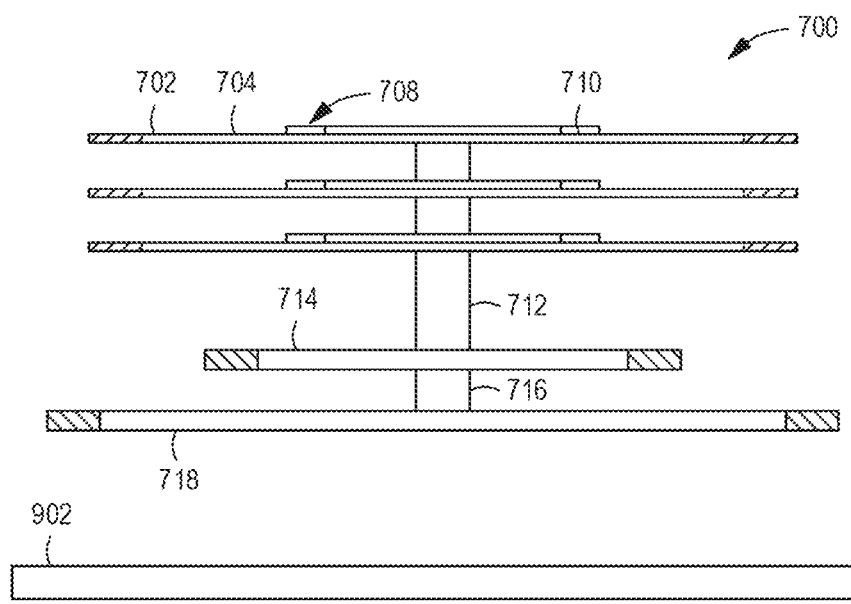

FIGS. 10A and 10B are partial cross sectional isometric views of a substrate support in different supporting positions in accordance with at least some embodiments of the present disclosure. FIG. 10A shows the substrate support 700 in a transfer position having the lift surfaces 710 disposed above the support surfaces 704. In such a configuration, the second actuator 614 lifts the lift base 718 closer to the support base 714. Alternatively, the first actuator 612 lowers the support base 714 closer to the lift base 718.

FIG. 10B shows the substrate support 700 in a processing position having the lift surfaces 710 disposed even with or below the support surfaces 704. In such a configuration, the first actuator 612 lowers the lift base 718 away from the support base 714. Alternatively, the second actuator 614 lowers the support base 714 away from the lift base 718. In some embodiments, the lift base 718 can move about 50.0 mm to about 80.0 mm between the processing position and the transfer position.

While the foregoing is directed to embodiments of the present disclosure, other and further embodiments of the disclosure may be devised without departing from the basic scope thereof.

The invention claimed is:

1. A substrate support for supporting a plurality of substrates, comprising:
a plurality of substrate support elements having a ring shape and configured to support a plurality of substrates in a vertically spaced apart relation; and
and a guiding mechanism attached to the lift base to allow lift members movement relative to substrate support elements.

2. The substrate support of claim 1, wherein each of the plurality of substrate support elements include slots to accommodate fingers having lift surfaces extending from each of the plurality of substrate lift elements.

3. The substrate support of claim 1, wherein the plurality of substrate lift elements are movable with respect to the plurality of substrate support elements between a processing position, in which each substrate lift element of the plurality of substrate lift elements is disposed below a corresponding one of the plurality of substrate support elements and a transfer position, in which each substrate lift element of the plurality of substrate lift elements is disposed above the corresponding one of the plurality of substrate support elements.

4. The substrate support of claim 1, wherein each of the plurality of substrate support elements includes a support guide having a sloped surface.

5. The substrate support of claim 1, further comprising a lift base coupled to the plurality of substrate lift elements, wherein the lift base includes an opening to facilitate coupling the lift base to an actuator.

6. The substrate support of claim 5, further comprising a support base coupled to the plurality of substrate support elements, wherein the support base includes an opening to facilitate coupling the support base to a second actuator.

7. A substrate support for supporting a plurality of substrates, comprising:
a lift base;
a plurality of substrate lift members coupled to the lift base;
a support base disposed between the lift base and the plurality of substrate lift members and movable with respect to the lift base; and
a plurality of substrate support members coupled to the support base and configured to support a plurality of substrates in a vertically spaced apart relation, wherein the plurality of substrate lift members interface with the plurality of substrate support members to selectively raise or lower substrates off of or onto respective substrate support members, wherein the plurality of substrate support members can be raised or lowered independently from the plurality of substrate lift members, and the plurality of substrate lift members can be raised or lowered independently from the plurality of substrate support members
and a guiding mechanism attached to the lift base to allow lift members movement relative to substrate support elements.

8. The substrate support of claim 7, further comprising:
one or more guide pins extending from the lift base and passing through corresponding openings in the support base, wherein the guide pins do not constrain movement of the support base in an axial direction of the guide pins.

9. The substrate support of claim 7, further comprising:
one or more openings formed through the lift base; and
one or more corresponding strike surfaces of the support base disposed over the one or more openings.

10. The substrate support of claim 7, further comprising:
one or more support guides disposed along the substrate support members along a diameter equal to or slightly greater than a given diameter of a substrate to be supported.

11. The substrate support of claim 7, wherein an outer diameter of the lift base is greater than an outer diameter of the support base.

12. A substrate processing system, comprising:
a process chamber having an interior volume;
the substrate support of claim 7 disposed in the interior volume;
a selectively sealable opening formed in a wall of the process chamber; and
an actuator coupled to the lift base to control a position thereof in at least a processing position and a transfer position.

13. The substrate processing system of claim 12, wherein the process chamber is configured as a degas chamber for degassing substrates.

14. The substrate processing system of claim 12, further comprising:

a second selectively sealable opening formed in a wall of the process chamber.

15. The substrate processing system of claim 12, wherein the substrate support further comprises:
   one or more openings formed through the lift base; and
   one or more corresponding strike surfaces of the support base disposed over the one or more openings; and
   wherein the substrate processing system further comprises:
   one or more posts disposed in a fixed position below the substrate support and positioned to extend through the one or more openings of the lift base and to contact the one or more corresponding strike surfaces of the support base when the substrate support is in the processing position.

16. The substrate processing system of claim 12, wherein the support base is coupled to a second actuator to control a position thereof in at least a processing position and a transfer position.

17. A substrate processing system, comprising:
   a process chamber having an interior volume;
   a substrate support disposed in the interior volume, the substrate support having a lift base coupled to a plurality of substrate lift members via a lift arm and a support base coupled to a plurality of substrate support members via a support arm;
   a selectively sealable opening formed in a wall of the process chamber; and
   a first actuator coupled to the lift base to control a position of the plurality of substrate lift members at least between a transfer position and a processing position, and a second actuator coupled to the support base configured to control a position of the plurality of substrate support members, wherein the plurality of substrate support members can be raised or lowered independently from the plurality of substrate lift members, and the plurality of substrate lift members can be raised or lowered independently from the plurality of substrate support members
   and a guiding mechanism attached to the lift base to allow substrate lift members movement relative to substrate support.

18. The substrate processing system of claim 17, wherein the lift base has a ring shape and a diameter of an inner sidewall of the lift base is greater than an outer diameter of the support base.

19. The substrate processing system of claim 17, wherein the lift arm is disposed radially outward of the support arm.

* * * * *

UNITED STATES PATENT AND TRADEMARK OFFICE
CERTIFICATE OF CORRECTION

PATENT NO.       : 11,784,075 B2
APPLICATION NO.  : 17/227442
DATED            : October 10, 2023
INVENTOR(S)      : Shashidhara Patel, Ananthkrishna Jupudi and Ribhu Gautam It is certified that error appears in the above-identified patent and that said Letters Patent is hereby corrected as shown below:

In the Claims

Column 11, in Claim 1 Line 51 insert --a plurality of substrate lift elements interfacing with the plurality of substrate support elements and configured to simultaneously selectively raise or lower substrates off of or onto respective substrate support elements, wherein the plurality of substrate support elements may be raised or lowered independently from the plurality of substrate lift elements, and the plurality of substrate lift elements may be raised or lowered independently from the plurality of substrate support elements;
    and a guiding mechanism coupled to the substrate lift elements to allow their movement relative to substrate support elements.--

Column 11, in Claim 1 Line 51 delete "and a guiding mechanism attached to the lift base to allow lift members movement relative to substrate support elements."

Signed and Sealed this
Thirteenth Day of February, 2024

Katherine Kelly Vidal
*Director of the United States Patent and Trademark Office*